(12) United States Patent
Hua et al.

(10) Patent No.: US 7,314,819 B2
(45) Date of Patent: Jan. 1, 2008

(54) BALL-LIMITING METALLURGIES, SOLDER BUMP COMPOSITIONS USED THEREWITH, PACKAGES ASSEMBLED THEREBY, AND METHODS OF ASSEMBLING SAME

(75) Inventors: Fay Hua, Fremont, CA (US); Albert T. Wu, Taoyuan (TW); Kevin Jeng, Cupertino, CA (US); Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 11/173,238

(22) Filed: Jun. 30, 2005

(65) Prior Publication Data

US 2007/0004086 A1 Jan. 4, 2007

(51) Int. Cl.
*H01L 21/44* (2006.01)
*H05K 3/34* (2006.01)
(52) U.S. Cl. .................. 438/614; 438/612; 29/840; 29/860; 228/180.22
(58) Field of Classification Search ............... 438/612, 438/614; 228/180.22; 29/840, 843, 860
See application file for complete search history.

(56) References Cited

U.S. PATENT DOCUMENTS

| | | | | |
|---|---|---|---|---|
| 5,891,756 A | * | 4/1999 | Erickson | 438/108 |
| 6,162,652 A | * | 12/2000 | Dass et al. | 438/18 |
| 6,417,089 B1 | * | 7/2002 | Kim et al. | 438/612 |
| 6,521,996 B1 | * | 2/2003 | Seshan | 257/737 |
| 6,818,545 B2 | * | 11/2004 | Lee et al. | 438/614 |
| 6,853,076 B2 | * | 2/2005 | Datta et al. | 257/738 |
| 7,217,645 B2 | * | 5/2007 | Yamashita et al. | 438/612 |

\* cited by examiner

*Primary Examiner*—B. William Baumeister
*Assistant Examiner*—Jenny L Wagner
(74) *Attorney, Agent, or Firm*—Schwegman, Lundberg & Woessner, P.A.

(57) ABSTRACT

A ball-limiting metallurgy (BLM) stack is provided for an electrical device. The BLM stack resists tin migration toward the metallization of the device. A solder system is also provided that includes a eutectic-Pb solder on a substrate that is mated to a high-Pb solder, and that withstands higher temperature reflows and other higher temperature processes.

23 Claims, 9 Drawing Sheets

US 7,314,819 B2

BALL-LIMITING METALLURGIES, SOLDER BUMP COMPOSITIONS USED THEREWITH, PACKAGES ASSEMBLED THEREBY, AND METHODS OF ASSEMBLING SAME

TECHNICAL FIELD

Embodiments relate generally to integrated circuit fabrication. More particularly, embodiments relate to electrical connection technology. In particular, the embodiments relate to a ball-limiting metallurgy, a solder-bump metallurgy, and a package achieved thereby.

BACKGROUND INFORMATION

Electrical bump connectors such as metal bumps or balls are used in flip-chip (C4) applications. As the progress of miniaturization and the requirement for Pb-free solders continues, conventional bump metallurgies are becoming inadequate for elevated-temperature processing. Additionally, the sizes of individual metal grains in the junction between a microelectronic device metallization and the electrical bump become increasingly problematic relative to the mass of the electrical bump. Consequently, junction disparities have an increasingly detrimental effect on electrical communication between the device and the electrical bump. Elevated process temperatures that are required for Pb-free solder processing is also problematic for conventional bump metallurgies.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a ball-limiting metallurgy (BLM) stack that facilitates miniaturization and that resists electrical discontinuities between metallization and metal bumps. Embodiments also relate to ball metallurgies that are useful alone, or in connection with the disclosed BLM stack embodiments.

The following description includes terms, such as upper, lower, first, second, etc. that are used for descriptive purposes only and are not to be construed as limiting. The embodiments of an apparatus or article described herein can be manufactured, used, or shipped in a number of positions and orientations.

The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be upon the board surface. As depicted in this disclosure, a bond pad is not limited to being flush or being upon the surface only because it is illustrated as such, unless it is explicitly stated in the text.

A "solder bump" or "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used, such as a pin in a pin-grid array.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments.

Additional structures known in the art have not been included to maintain the clarity of the drawings.

Figure 1A:
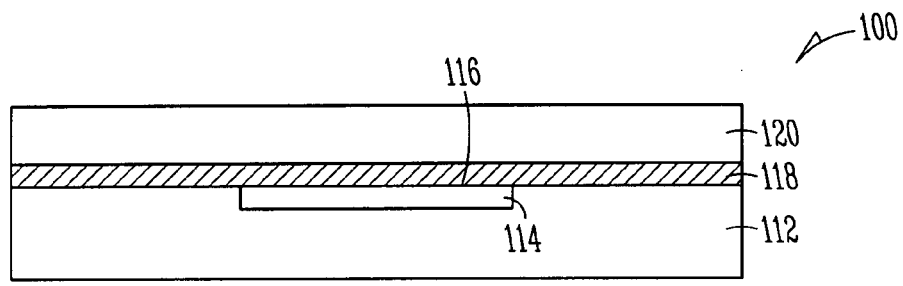
FIG. 1A is an elevational cross-section of a semiconductor structure that reveals metallization according to an embodiment.

FIG. 1A is an elevational cross-section of a semiconductor structure 100 that reveals metallization according to an embodiment. FIG. 1A illustrates a section of a semiconductor structure 100 during fabrication that includes a substrate 112 and a bond pad 114 such as a copper pad. The copper pad makes connection to what is commonly referred to as any of metal-one metallization (M1) up to and including metal seven metallization (M7) by way of non-limiting example. In other words, if M1 is contacted, it is the only existing metallization. And if, e.g., M6 makes connection to the bond pad 114, it is the last metallization on the structure 100.

Figure 1B:
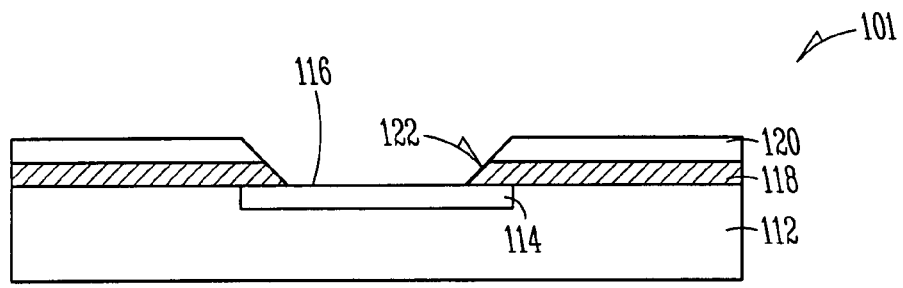
FIG. 1B is an elevational cross-section of the semiconductor structure depicted in FIG. 1A after patterning of a passivation layer.

In an embodiment, the bond pad 114 is disposed in an upper surface 116 of the substrate 112 where the substrate 112 is an interlayer dielectric (ILD) composition. In an embodiment, a nitride layer 118 is formed over the substrate 112, and a passivation layer 120 is formed over the nitride layer 118, the substrate 112, and the bond pad 114. The passivation layer 120 and the nitride layer 118 act to protect the substrate 112 and to expose the bond pad 114 according to the patterning scheme. In an embodiment, the passivation layer 120 is a polyimide material. In an embodiment, the passivation layer 120 is an inorganic material such as a silicon oxide that is formed by the decomposition of tetraethyl ortho silicate (TEOS). Patterning is accomplished by a first mask (not pictured) that exposes the passivation layer 120. A recess 122 (see FIG. 1B) is formed during an etch process. FIG. 1B is an elevational cross-section of the semiconductor structure depicted in FIG. 1A after patterning of the passivation layer 120. The semiconductor structure 101 includes a patterned passivation structure, that includes portions of the nitride layer 118 and the passivation layer 120, and that exposes a portion of the bond pad 114. In an embodiment, the process is carried out by blanket forming the nitride layer 118 and the passivation layer 120, followed by patterning and etching the recess 122, and by curing the passivation layer 120 where the passivation layer 120 is a polyimide.

Figure 1C:
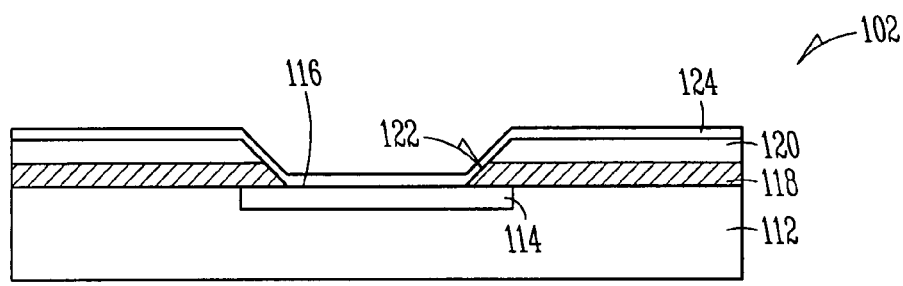
FIG. 1C is an elevational cross-section of the semiconductor structure depicted in FIG. 1B after further processing.

FIG. 1C is an elevational cross-section of the semiconductor structure depicted in FIG. 1B after further processing. The semiconductor structure 102 illustrates further processing that is carried out where the patterned passivation layer 120, the nitride layer 118, and the bond pad 114 are covered with a refractory metal first layer 124. In an embodiment, the refractory metal first layer 124 is a refractory metal such as at least one of titanium, zirconium, hafnium, and the like. In an embodiment, the refractory metal first layer 124 includes at least one of nickel, cobalt, palladium, platinum, and the like. In an embodiment, the refractory metal first layer 124 includes at least one of chromium, molybdenum, tungsten, and the like. In an embodiment, the refractory metal first layer 124 is a combination of no more than two of the above refractory metals. In an embodiment, the refractory metal first layer 124 is a combination of no more than three of the above refractory metals. In an embodiment, the refractory metal first layer 124 is a combination of at least three of the above refractory metals.

In an embodiment, the refractory metal first layer 124 is a metal first layer that exhibits sufficient adhesion to the bond pad 114 so that liftoff or spalling thereof will not occur during fabrication, test, and ordinary field use in a product.

In an embodiment, the refractory metal first layer 124 is titanium that is formed by physical vapor deposition (PVD) in a thickness range from about 1,000 Å to about 15,000 Å. In an embodiment, the thickness is about 10,000 Å. In an embodiment, the refractory metal first layer 124 is chromium that is formed by PVD in a thickness range from about 1,000 Å to about 8,000 Å. In an embodiment, the thickness is about 5,000 Å.

Figure 1D:
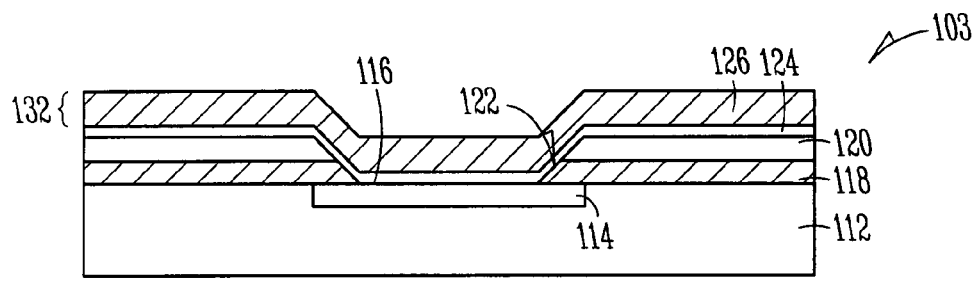
FIG. 1D is an elevational cross-section of the semiconductor structure depicted in FIG. 1C after further processing.

FIG. 1D is an elevational cross-section of the semiconductor structure depicted in FIG. 1C after further processing. The semiconductor structure 103 illustrates further processing in which the metal first layer 124 is covered with a portion of what is to become a laminate metal second layer 132. In an embodiment, the laminate metal second layer 132 includes an aluminum or an aluminum alloy layer 126 (hereinafter, aluminum layer). In an embodiment, the aluminum layer 126 is formed by PVD to a thickness in a range from about 5,000 Å to about 15,000 Å. In an embodiment, the aluminum layer 126 is about 10,000 Å thick.

Figure 1E:
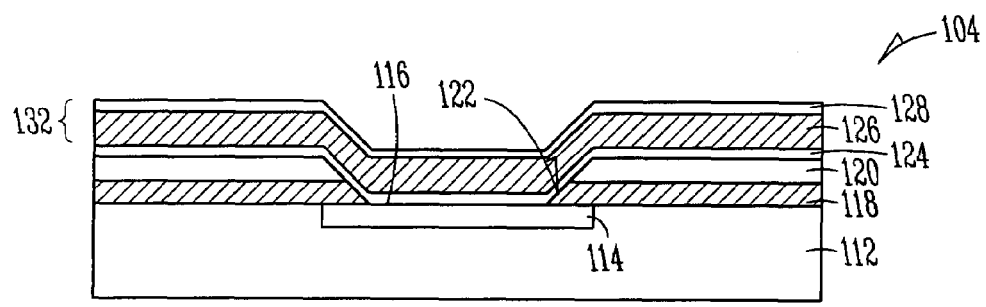
FIG. 1E is an elevational cross-section of the semiconductor structure depicted in FIG. 1D after further processing.

FIG. 1E is an elevational cross-section of the semiconductor stricture depicted in FIG. 1D after further processing. The semiconductor structure 104 illustrates further processing in which the laminate metal second layer 132 has been added upon to include the aluminum layer 126 and a refractory metal laminate layer 128. In an embodiment, refractory metal laminate layer 128 is substantially the same composition as refractory metal first layer 124, within usual process variations. In an embodiment, the refractory metal laminate layer 128 is substantially the same metal type as the refractory metal first layer 124 according to grouping as set forth herein. In an embodiment, "substantially the same metal" or "substantially the same composition" is referred to as substantially the same metal type according to grouping as set forth herein. In an embodiment, the refractory metal laminate layer 128 is titanium that is formed by PVD in a thickness range from about 1,000 Å to about 15,000 Å. In an embodiment, the thickness is about 10,000 Å. In an embodiment, the refractory metal laminate layer 128 is chromium that is formed by PVD in a thickness range from about 1,000 Å to about 8,000 Å. In an embodiment, the thickness is about 5,000 Å.

Figure 1F:
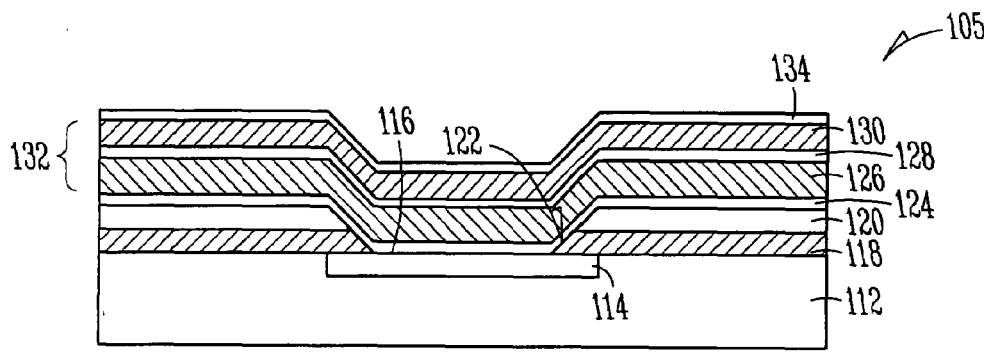
FIG. 1F is an elevational cross-section of the semiconductor structure depicted in FIG. 1E after further processing.

FIG. 1F is an elevational cross-section of the semiconductor structure depicted in FIG. 1D after further processing. The semiconductor structure 105 illustrates further processing in which the laminate metal second layer 132 has been further added upon to include the aluminum layer 126, the refractory metal laminate layer 128, and a laminate upper layer 130. In an embodiment, the laminate upper layer 130 includes a refractory metal alloyed with vanadium. In an embodiment, the laminate upper layer 130 includes NiV. In an embodiment, the laminate upper layer 130 is NiV that is formed by PVD in a thickness range from about 2,000 Å to about 6,000 Å. In an embodiment, the thickness is about 4,000 Å.

In an embodiment, the laminate upper layer 130 is nitrided to form a nitrided metal alloy or a nitrided vanadium-doped metal as set forth herein. Nitriding conditions may be carried out according to known technique for nitridation of metals. In selected embodiments, the laminate upper layer 130 is a nitrided refractory metal-vanadium alloy or a nitrided, vanadium-doped refractory metal. In other selected embodiments, the laminate upper layer 130 is a nitrided NiV alloy or a nitrided vanadium-doped nickel.

In an embodiment, the semiconductor structure 105 can be codified, in part with the designation, Al/R1/R2V. The symbol, Al, represents the aluminum layer 126. The symbol R1 represents the refractory metal laminate layer 128. The symbol R2V represents the laminate upper layer 130, which includes a refractory metal alloyed with vanadium.

FIG. 1F also illustrates further processing of the semiconductor structure 105, in which an upper layer of a copper cap layer 134 has been formed over the laminate metal second layer 132. In an embodiment, the copper cap layer 134 is formed by PVD in a thickness range from about 1,000 Å to about 10,000 Å. In an embodiment, the thickness range is from about 3,000 Å to about 8,000 Å. In an embodiment, the thickness is about 5,000 Å.

In an embodiment, sputtering of the metal layers 124, 126, 128, 130, and 134 is carried out in order to have them, or one or more of them, carry a compressive stress that will resist liftoff from the patterned passivation layer 120 and from the bond pad 114. Such processing conditions are known in the art.

In an embodiment, the metal layers 124, 126, 128, 130, and 134, or a subset thereof, are formed by evaporation deposition of a material such as from an organometallic material as is known in the art.

Figure 1G:
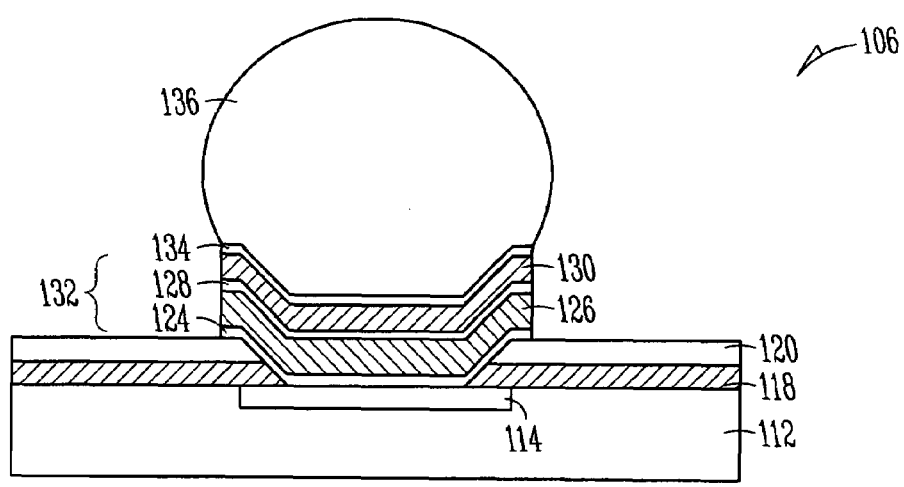
FIG. 1G is an elevational cross-section of the semiconductor structure depicted in FIG. 1F after further processing.

FIG. 1G is an elevational cross-section of the semiconductor structure depicted in FIG. 1F after further processing. The semiconductor structure 106 illustrates the formation of a bump 136 following a patterning of the metal layers 124, 126, 128, 130, and 134. Following the patterning of the metal layers 124, 126, 128, 130, and 134 as set forth herein, processing continues by plating a bump precursor over the metal layers 124, 126, 128, 130, and 134. In an embodiment, bump plating is electroplating as is known in the art. In an embodiment, formation of the bump 136 is carried out by plating through an ashable mask (not depicted).

After bump plating, reflow is carried out to form the bump 136 as depicted in FIG. 1G.

Figure 2:
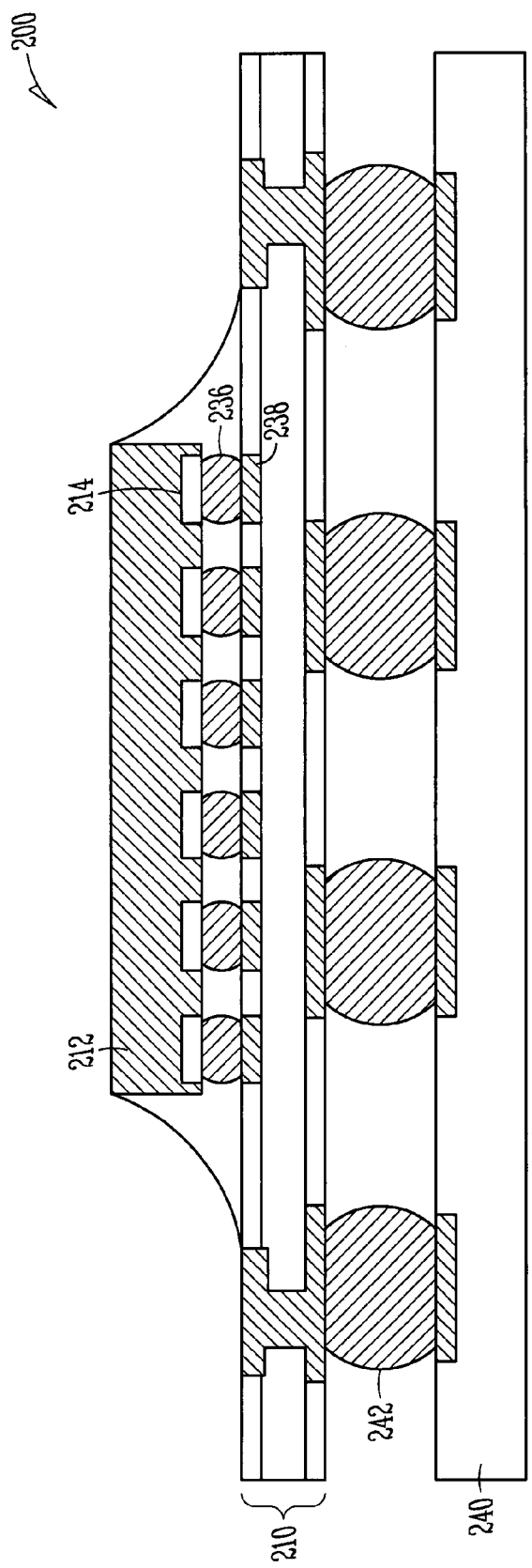
FIG. 2 is an elevational cross-section that incorporates the semiconductor structure depicted in FIG. 1G according to an embodiment.

FIG. 2 is an elevational cross-section that incorporates the semiconductor structure depicted in FIG. 1G according to an embodiment. A package 200 is depicted. The package 200 includes a substrate 210, which is a substrate for mounting a microelectronic device 212 according to an embodiment. For example, the microelectronic device 212 in FIG. 2 can be the microelectronic device 112 depicted in FIG. 1G.

In an embodiment, the substrate 210 is a second level substrate, for example, an interposer for a processor such as the microelectronic device 212. In an embodiment, the substrate 210 is part of a printed wiring board (PWB) such as a main board. In an embodiment, the substrate 210 is part of a mezzanine PWB. In an embodiment, the substrate 210 is part of an expansion card PWB. In an embodiment, the substrate 210 is part of a small PWB such as a board for a handheld device such as a cell phone or a personal digital assistant (PDA).

The microelectronic device 212 is bonded through bond pads 214 that may include a BLM according to any of the embodiments set forth in this disclosure. Electrical communication is carried out through a first solder that is represented in FIG. 2 as a bump 236. The first solder can be the bump 136 depicted in FIG. 1G. The bump 236 is coupled to a mounting substrate bond pad 238.

The mounting substrate 210 is second attached to a board 240 through a second solder ball grid array, one ball of which is designated with the reference numeral 242. In an embodiment, the second solder bump 242 is a Pb-free solder such as SnAgCu. In an embodiment, the second solder bump 242 is a Pb-free solder such as SnAg. In an embodiment, the second solder bump 242 is a Pb-free solder such as SnCu.

In a embodiment, the bump 236 includes a high-Pb first solder that reflows in a peak temperature range from about 360° C. to about 450° C. In an embodiment, the high-Pb first solder includes Sn97Pb. After second attaching the mounting substrate 210 to the board 240, the second solder of the ball-grid array 242 is reflowed at a second peak temperature in a range from about 230° C. to about 260° C.

After second attaching the mounting substrate 210 to the board 240, further processing such as further process heating or further testing, is carried out according to an embodiment. In an embodiment, further processing is carried out at about 240° C. up to the reflow temperature. In an embodiment, further processing is carried out in a temperature range from about 220° C. to about 280° C. Other bump metallurgies and processes are set forth and discussed with respect to FIGS. 3 and 4, below.

Figure 3:
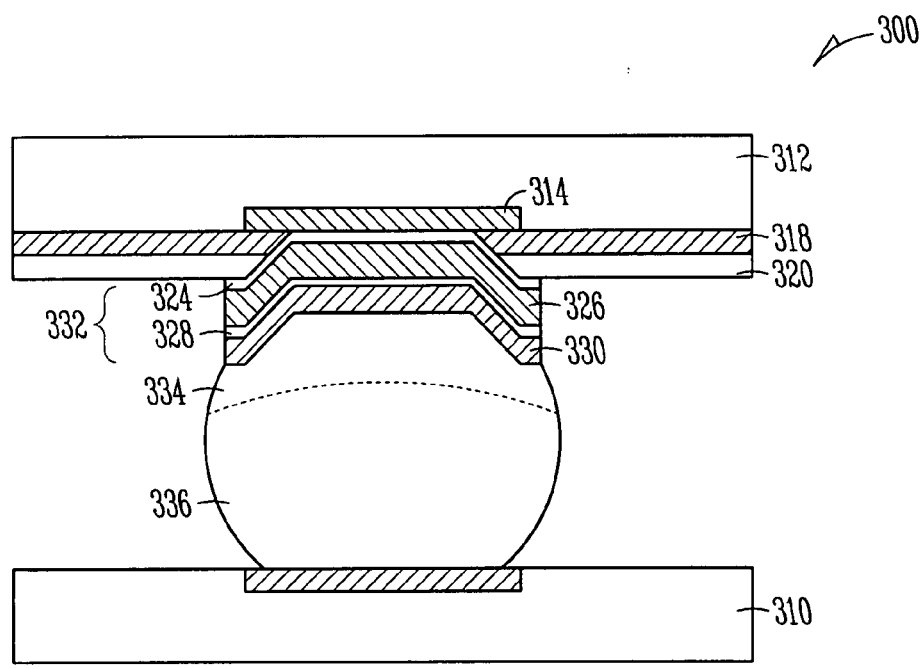
FIG. 3 is an elevational cross-section of a semiconductor structure that is taken from FIG. 2 according to an embodiment.

FIG. 3 is an elevational cross-section of a semiconductor stricture 300 that is taken from FIG. 2 according to an embodiment. The semiconductor structure 300 includes a substrate 312, a bond pad 314, a nitride layer 318, and a passivation layer 320. The semiconductor structure 300 also includes a metal first layer 324 and a laminate metal second layer 332. The laminate metal second layer 332 includes an aluminum layer 326, a refractory metal laminate layer 328, and a laminate upper layer 330. The semiconductor structure 300 is depicted after a reflow process.

In FIG. 3, the copper cap layer (see e.g., the copper cap layer 134 in FIG. 1G) has been reacted with the $Sn_3Pb$ first solder that makes up the bump. Accordingly, in place of the copper cap layer, the solution, reaction, and mixture products of the copper cap layer and the high-Pb bump 336 includes a $Cu_6Sn_5$ portion and also the high-Pb portion.

In FIG. 3, the bump is depicted as a high-Pb portion 336 and the $Cu_6Sn_5$ intermetallic portion 334, which are designated as adjacent and contiguous by a dashed line, set forth in arbitrary shape and location. In an embodiment, some of the high-Pb portion 336 is in solid solution with the $Cu_6Sn_5$ intermetallic portion 334. In an embodiment, the actual interface between substantially unalloyed high-Pb first solder 336 and the $Cu_6Sn_5$ intermetallic portion 334 of the bump is a composition gradient therebetween. Additionally, the bump is disposed on the mounting substrate 310.

Figure 4:
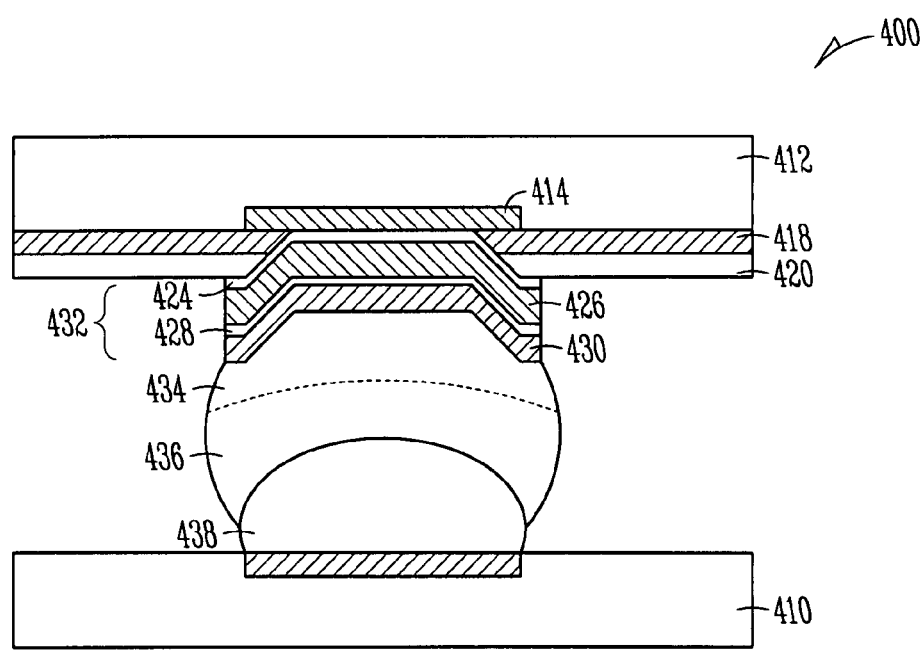
FIG. 4 is an elevational cross-section of a semiconductor structure that is taken from FIG. 2 according to an embodiment.

FIG. 4 is an elevational cross-section of a semiconductor structure 400 that is taken from FIG. 2 according to an embodiment. The semiconductor structure 400 includes a substrate 412, a bond pad 414, a nitride layer 418, and a passivation layer 420. The semiconductor structure 400 also includes a metal first layer 424 and a laminate metal second layer 432. The laminate metal second layer 432 includes an aluminum layer 426, a refractory metal laminate layer 428, and a laminate upper layer 430. The semiconductor structure 400 is illustrated after a reflow process that occurs in a range from about 200° C. to about 240° C. according to an embodiment.

During second attaching of a mounting substrate to a board, the board is first prepared with a eutectic-Pb second solder 438, such that the high-Pb solder 436 on the substrate 412 makes unhindered direct contact with the eutectic-Pb solder 438, but the intermetallic portion 434 resists dissolution of Pb into the NiV of the laminate upper layer 430.

In FIG. 4, the copper cap layer (see e.g., the copper cap layer 134 in FIG. 1G) has been reacted with the $Pb_3Sn$ solder that makes up the bump. Accordingly, in place of the copper cap layer, the solution, reaction, and mixture products of the copper cap layer and the high-Pb bump 336 includes a $Cu_6Sn_5$ eutectic portion 434 and also the high-Pb portion 436.

In FIG. 4, the bump is depicted as the high-Pb portion 436 and the $Cu_6Sn_5$ intermetallic portion 434 that is formed as a barrier to prevent further reaction of tin with the NiV. The high-Pb portion 436 and a $Cu_6Sn_5$ intermetallic portion 434 are designated as adjacent and contiguous by a dashed line, set forth in arbitrary shape and location. Additionally, the bump includes the eutectic-Pb second solder 438 that is disposed on the mounting substrate 410 and that is in direct and contiguous contact with the high-Pb first solder 436. In an embodiment, the second solder bump 438 is a Pb-free solder such as SnAgCu. In an embodiment, the second solder bump 438 is a Pb-free solder such as SnAg. In an embodiment, the second solder bump 438 is a Pb-free solder such as SnCu.

Figure 5A:
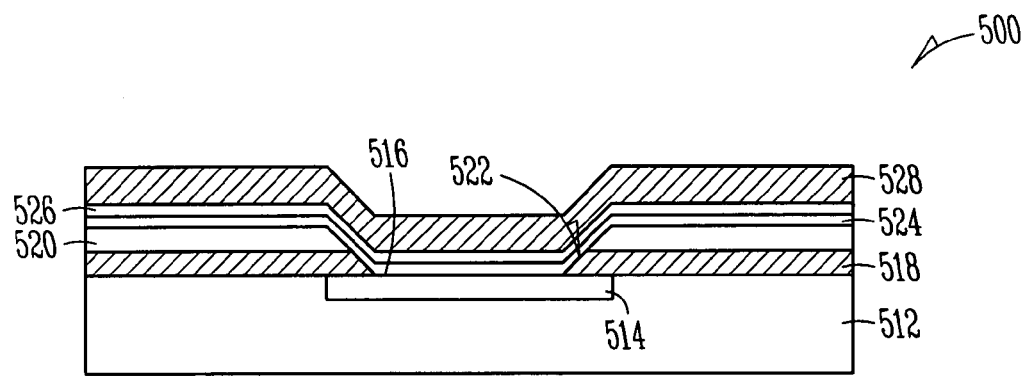
FIG. 5A is an elevational cross-section of a semiconductor structure that reveals metallization according to an embodiment.

FIG. 5A is an elevational cross-section of a semiconductor structure 500 that reveals metallization according to an embodiment. FIG. 5A illustrates a section of a semiconductor structure 500 during fabrication that includes a substrate 512 and a bond pad 514 such as a copper pad. The bond pad 514 makes connection to what is commonly referred to as any of M1 up to and including M7 by way of non-limiting example. In other words, if M1 is contacted, it is the only existing metallization. And if, e.g., M6 makes connection to the bond pad 514, it is the last metallization on the structure 500.

In an embodiment, the bond pad 514 is disposed in an upper surface 516 of the substrate 512 where the substrate 512 is an ILD composition. In an embodiment, a nitride layer 518 is formed over the substrate 512, and a passivation layer 520 is formed over the nitride layer 518, the substrate 512, and the metallization 514. The passivation layer 520 and the nitride layer 518 act to protect the substrate 512 and to expose the metallization 514 according to the patterning scheme. In an embodiment, the passivation layer 520 is a polyimide material. In an embodiment, the passivation layer 520 is an inorganic material such as a silicon oxide that is formed by the decomposition of TEOS. Patterning is accomplished that exposes the passivation layer 520.

After patterning of the passivation layer 520, the structure has been covered with a refractory metal first layer 524. In an embodiment, the refractory metal first layer 524 is a refractory metal such as at least one of titanium, zirconium, hafnium, and the like. In an embodiment, the refractory metal first layer 524 includes at least one of nickel, cobalt, palladium, platinum, and the like. In an embodiment, the refractory metal first layer 524 includes at least one of chromium, molybdenum, tungsten, and the like. In an embodiment, the refractory metal first layer 524 is a combination of no more than two of the above refractory metals. In an embodiment, the refractory metal first layer 524 is a combination of no more than three of the above refractory metals. In an embodiment, the refractory metal first layer 524 is a combination of at least three of the above refractory metals.

In an embodiment, the refractory metal first layer 524 is titanium that is formed by PVD in a thickness range from about 500 Å to about 1,500 Å. In an embodiment, the thickness is about 1,000 Å. In an embodiment, the refractory metal first layer 524 is chromium that is formed by PVD in a thickness range from about 500 Å to about 1,500 Å. In an embodiment, the thickness is about 1,000 Å.

The semiconductor structure 500 also illustrates further processing in which the metal first layer 524 is covered with a metal second layer 526. In an embodiment, the metal second layer 526 includes a refractory metal alloyed with vanadium. In an embodiment, the metal second layer 526 includes NiV. In an embodiment, the metal second layer 526 is NiV that is formed by PVD in a thickness range from about 2,000 Å to about 6,000 Å. In an embodiment, the thickness is about 4,000 Å.

In an embodiment, the metal second layer 526 is nitrided to form a nitrided metal alloy or a nitrided vanadium-doped metal as set forth herein. Nitriding conditions may be carried out according to known technique for nitridation of metals. In selected embodiments, the metal second layer 526 is a nitrided refractory metal-vanadium alloy or a nitrided, vanadium-doped refractory metal. In other selected embodiments, the metal second layer 526 is a nitrided NiV alloy or a nitrided vanadium-doped nickel.

FIG. 5A also illustrates further processing of the semiconductor structure 500, in which an upper layer of a copper cap layer 528 has been formed over the metal second layer 526. In an embodiment, the copper cap layer 528 is formed by PVD in a thickness range from about 1,000 Å to about 10,000 Å. In an embodiment, the thickness range is from about 3,000 Å to about 8,000 Å. In an embodiment, the thickness is about 5,000 Å.

In an embodiment, sputtering of the metal layers 524, 526, and 528 is carried out in order to have them, or one or more of them, carry a compressive stress that will resist liftoff from the patterned layer 520 and from the metallization 514. Such processing conditions are known in the art.

In an embodiment, the metal layers 524, 526, and 528 or a subset thereof, are formed by evaporation deposition of a material such as from an organometallic material as is known in the art.

Figure 5B:
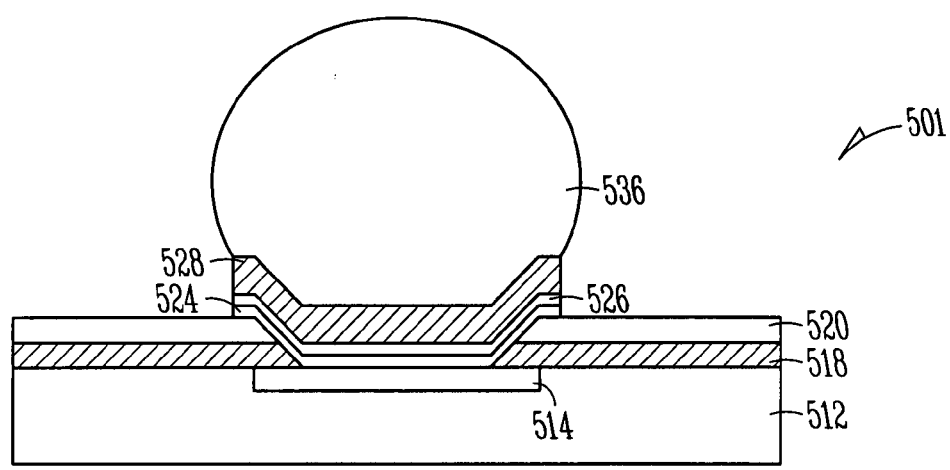
FIG. 5B is an elevational cross-section of the semiconductor structure depicted in FIG. 5A after further processing.

FIG. 5B is an elevational cross-section of the semiconductor structure depicted in FIG. 5A after further processing. The semiconductor structure 501 illustrates the formation of a first solder that is a bump 536 following a patterning of the metal layers 524, 526, and 528. Following the formation of the metal layers 524, 526, and 528 as set forth herein, processing continues by plating a bump precursor over the metal layers 524, 526, and 528. In an embodiment, plating is electroless plating as is known in the art. In an embodiment, plating is electroplating as is known in the art. In an embodiment, formation of the bump 536 is carried out by plating through an ashable mask (not depicted).

In an embodiment, the semiconductor structure 501 can be codified, in part with the designation, R2V. The symbol R2V represents the metal second layer 526, which includes a refractory metal alloyed with vanadium.

Figure 6:
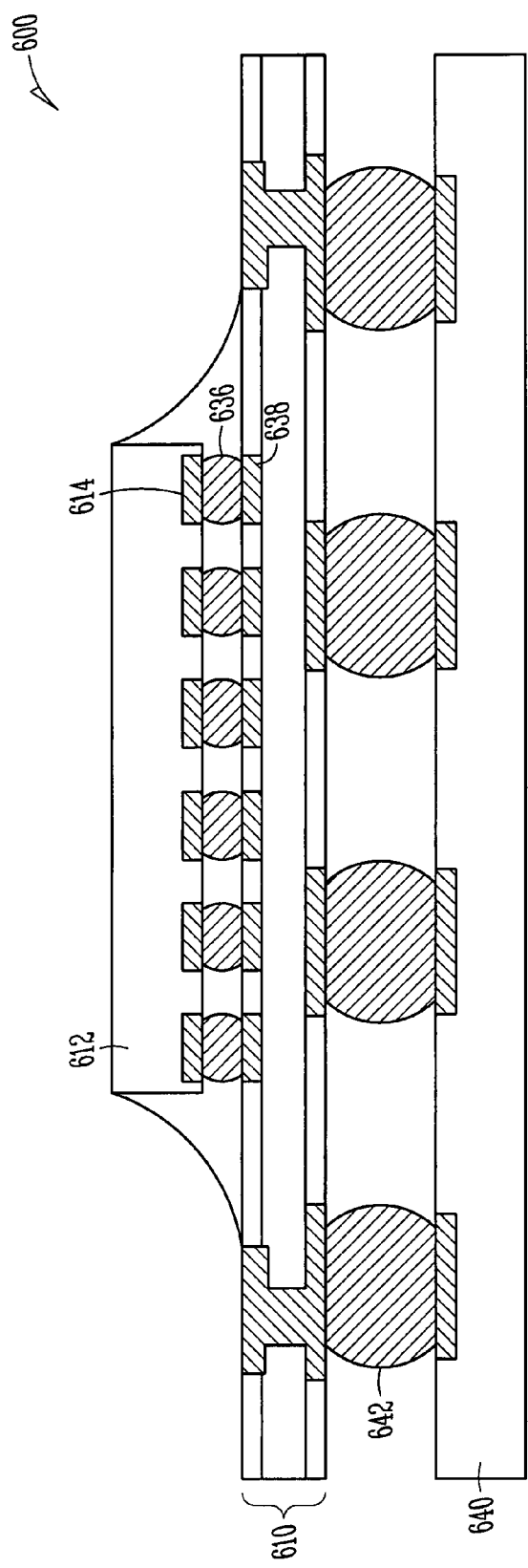
FIG. 6 is an elevational cross-section that incorporates the semiconductor structure depicted in FIG. 5B according to an embodiment.

FIG. 6 is an elevational cross-section that incorporates the semiconductor structure 501 depicted in FIG. 5B according to an embodiment. A package 600 is depicted. The package 600 includes a substrate 610, which is a substrate for mounting a microelectronic device 612 according to an embodiment. For example, the microelectronic device 612 can be the microelectronic device 512 depicted in FIG. 5B.

In an embodiment, the mounting substrate 610 is a second level substrate, for example, an interposer for a processor such as the microelectronic device 612. In an embodiment, the mounting substrate 610 is part of a PWB such as a main board. In an embodiment, the mounting substrate 610 is part of a mezzanine PWB. In an embodiment, the mounting substrate 610 is part of an expansion card PWB. In an embodiment, the mounting substrate 610 is part of a small PWB such as a board for a handheld device such as a cell phone or a PDA.

The microelectronic device 612 is bonded through bond pads 614 that may include a BLM according to any of the embodiments set forth in this disclosure. Electrical communication is carried out through a first solder that is represented in FIG. 6 as a bump 636. The first solder can be the bump 536 depicted in FIG. 5B. The bump 636 is coupled to a mounting substrate bond pad 638.

The mounting substrate 610 is second attached to a board 640 through a second solder ball grid array, one ball of which is designated with the reference numeral 642. In an embodiment, the second solder bump 642 is a lead-free solder such as SnAgCu. In an embodiment, the second solder bump 642 is a lead-free solder such as SnAg. In an embodiment, the second solder bump 642 is a lead-free solder such as SnCu. In an embodiment, the second solder bump 642 is a lead-free solder such as SnIn. In an embodiment, the second solder bump 642 is a lead-free solder such as SnInAg.

In an embodiment, the bump 636 includes a high-Pb first solder that reflows in a peak temperature range from about 360° C. to about 450° C. In an embodiment, the high-Pb first solder includes Sn97Pb. After second attaching the mounting substrate 610 to the board 640, the second solder of the ball-grid array 642 is reflowed at a second peak temperature in a range from about 230° C. to about 260° C.

After second attaching the mounting substrate 610 to the board 640, further processing or further testing is carried out according to an embodiment. In an embodiment, further processing is carried out at about 220° C. In an embodiment, further processing is carried out in a temperature range from about 240° C. to the reflow temperature.

Figure 7:
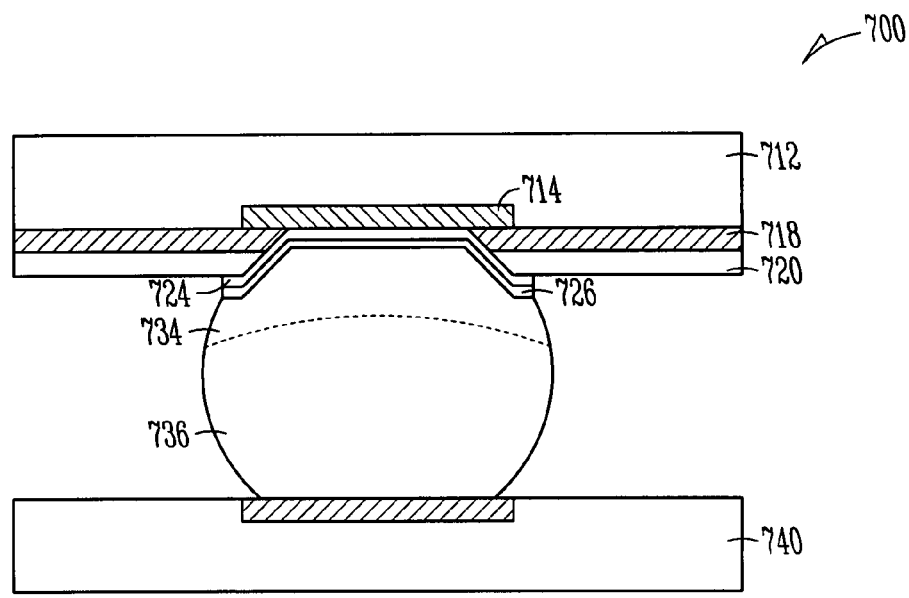
FIG. 7 is an elevational cross-section of a semiconductor structure that is taken from FIG. 6 according to an embodiment.

FIG. 7 is an elevational cross-section of a semiconductor structure 700 that is taken from FIG. 6 according to an embodiment. The semiconductor structure 700 includes a substrate 712, a bond pad 714, a nitride layer 718, and a passivation layer 720. The semiconductor structure 700 includes a refractory metal first layer 724 according to any of the embodiments set forth in this disclosure. The semiconductor structure 700 also includes a refractory metal alloyed with vanadium to form a metal second layer 726 according to any of the embodiments set forth in this disclosure. In an embodiment, the metal second layer 726 includes NiV. The semiconductor structure 700 is mounted to a board 740.

In FIG. 7, the copper cap layer (see e.g., the copper cap layer 528 in FIG. 5A) has been reacted with the Pb$_3$Sn solder that makes up the bump. Accordingly, in place of the copper cap layer, the solution, reaction, and mixture products of the copper cap layer and the high-Pb bump 736 includes a Cu$_6$Sn$_5$ intermetallic portion and also the high-Pb portion are present.

In FIG. 7, the bump is depicted as a high-Pb portion 736 and a Cu$_6$Sn$_5$ intermetallic portion 734, which are designated as adjacent and contiguous by a dashed line, set forth in arbitrary shape and location.

Figure 8:
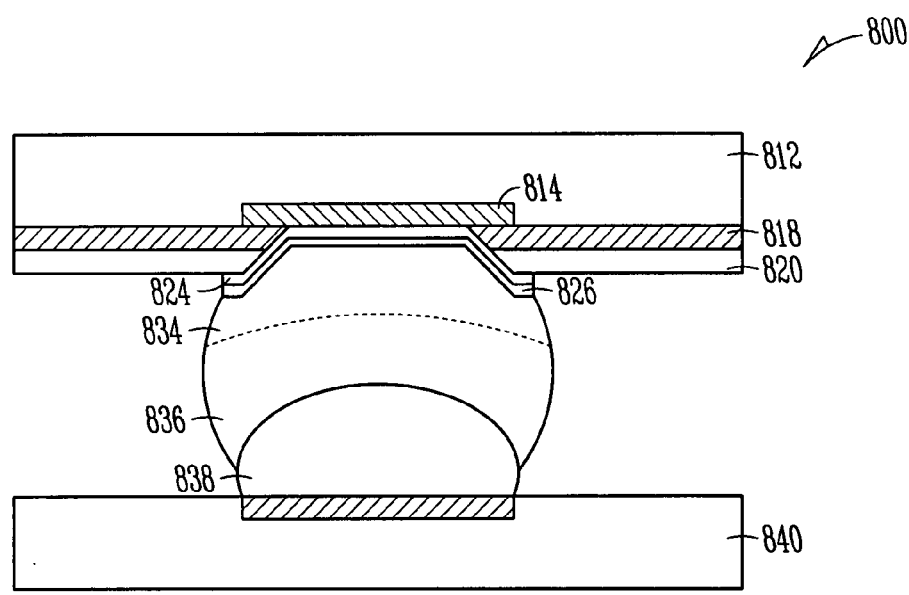
FIG. 8 is an elevational cross-section of a semiconductor structure that is taken from FIG. 6 according to an embodiment.

FIG. 8 is an elevational cross-section of a semiconductor structure 800 that is taken from FIG. 6 according to an embodiment. The semiconductor structure 800 includes a substrate 812, a bond pad 814, a nitride layer 818, and a passivation layer 820. The semiconductor structure 800 includes a refractory metal first layer 824 according to any of the embodiments set forth in this disclosure. The semiconductor structure 800 also includes a refractory metal alloyed with vanadium to form a metal second layer 826 according to any of the embodiments set forth in this disclosure. In an embodiment, the metal second layer 826 includes NiV. The semiconductor structure 800 is illustrated after a reflow process that occurs in a range from about 200° C. to about 240° C. according to an embodiment.

During second attaching of the substrate 812 to the mounting substrate 810, the mounting substrate 810 is first prepared with a eutectic-Pb second solder 838, such that the high-Pb solder on the substrate 812 makes unhindered direct contact with the eutectic-Pb second solder 838. In an embodiment, the second solder bump 838 is a Pb-free solder such as SnAgCu. In an embodiment, the second solder bump 838 is a Pb-free solder such as SnAg. In an embodiment, the second solder bump 838 is a Pb-free solder Such as SnCu.

In an embodiment, the second solder bump 838 is a Pb-free solder such as SnIn. In an embodiment, the second solder bump 838 is a Pb-free solder such as SnInAg.

In FIG. 8, the copper cap layer (see e.g., the copper cap layer 528 in FIG. 5B) has been reacted with the Pb$_3$Sn that makes up the bump. In an embodiment, the board 840 is mounted to a second solder bump (not pictured) such as the second solder bump 642 depicted in FIG. 6.

In FIG. 8, the bump is depicted as a high-Pb portion 836 and the Cu$_6$Sn$_5$ intermetallic portion 834, which are designated as adjacent and contiguous by a dashed line, set forth in arbitrary shape and location. In an embodiment, some of the high-Pb portion 836 is in solid solution with the Cu$_6$Sn$_5$ intermetallic portion 834. In an embodiment, the actual interface between substantially unalloyed high-Pb first solder 836 and the Cu$_6$Sn$_5$ intermetallic portion 834 of the bump is a composition gradient therebetween. Additionally, the bump is disposed on the mounting substrate 810 and is in direct and contiguous contact with the high-Pb first solder 836.

Figure 9:
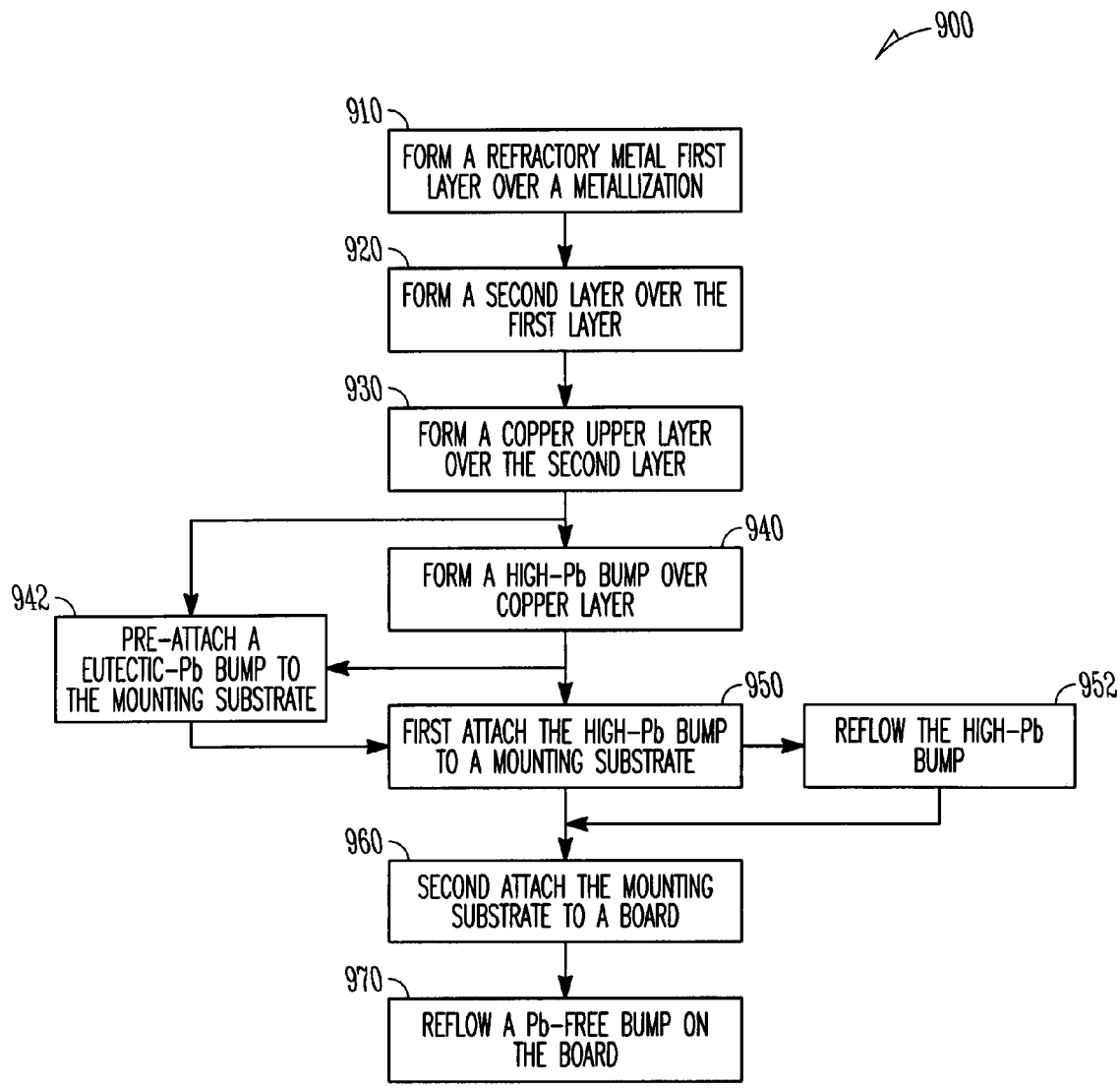
FIG. 9 is a flow chart that describes a process according to an embodiment.

FIG. 9 is a flow chart that describes a process 900 according to an embodiment.

At 910, the process includes forming a refractory metal first layer over a metallization. In a non-limiting illustration thereof, the refractory metal first layer 124 is formed over the bond pad 114.

At 920, the process includes forming a second layer over the first layer. In a non-limiting illustration thereof, the laminate metal second layer 132 is formed over the refractory metal first layer 124. In a non-limiting illustration thereof, the metal second layer 526 is formed over the refractory metal first layer 524.

At 930, the process includes forming a copper upper layer over the metal second layer. In a non-limiting illustration thereof, the copper Lipper layer 134 is formed over the laminate metal second layer 132. In a non-limiting illustration thereof, the copper upper layer 528 is formed over the metal second layer 526. In an embodiment, the process is completed at 930.

At 940, the process includes forming a high-Pb bump over the copper upper layer. In a non-limiting illustration thereof, the high-Pb bump 136 is formed over the copper upper layer 134. In a non-limiting illustration thereof, the high-Pb bump 536 is formed over the copper upper layer 528. In an embodiment, the process is completed at 940.

At 950, the process includes first attaching the high-Pb bump to a mounting substrate. In a non-limiting illustration thereof, the high-Pb bump 236 is attached to the mounting substrate 210. In an embodiment, the process is completed at 950.

At 942, the process includes pre-attaching a eutectic-Pb bump to a mounting substrate, prior to first attaching the high-Pb bump to the mounting substrate. In a non-limiting illustration thereof, the high-Pb bump 436 is attached to the mounting substrate 410, but a eutectic-Pb second solder 438 was pre-attached to the mounting substrate 410. In an embodiment, the process is completed at 950, including the process 942.

At 952, the process includes reflowing the high-Pb bump. In a non-limiting illustration thereof, the high-Pb bump 136 is reflowed. In an embodiment, the process is completed at 952.

At 960, the process includes second attaching the mounting substrate to a board. In a non-limiting illustration thereof, the mounting substrate 210 is attached to the board 240. In an embodiment, the process is completed at 960.

At 970, the process includes reflowing a Pb-free bump on the board. In a non-limiting illustration thereof, the second solder bump 242 is reflowed. In an embodiment, the process is completed at 970.

Figure 10:
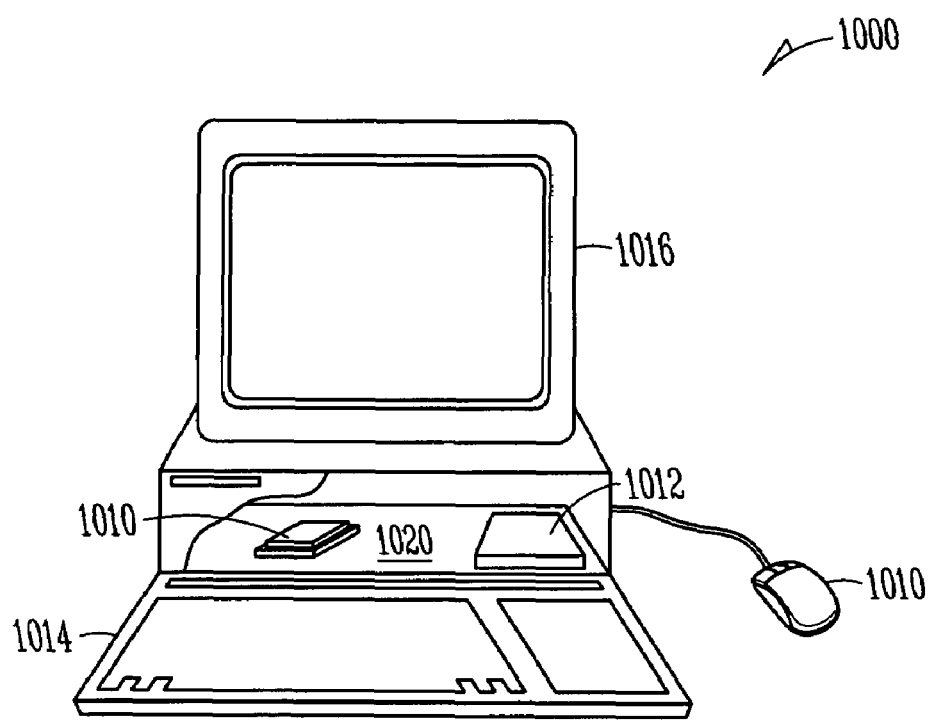
FIG. 10 is a cut-away elevation that depicts a computing system according to an embodiment.

FIG. 10 is a cut-away elevation that depicts a computing system 1000 according to an embodiment. One or more of the foregoing embodiments of the BLM and/or the high-Pb solder, the eutectic-Pb solder, and the Pb-free solder may be utilized in a computing system, such as a computing system 1000 of FIG. 10. Hereinafter any embodiment alone or in combination with any other embodiment is referred to as an embodiment(s) configuration.

The computing system 1100 includes at least one processor (not pictured), which is enclosed in a package 1010, a data storage system 1012, at least one input device such as keyboard 1014, and at least one output device such as monitor 1016, for example. The computing system 1000 includes a processor that processes data signals, and may include, for example, a microprocessor, available from Intel Corporation. In addition to the keyboard 1014, the computing system 1000 can include another user input device such as a mouse 1018, for example. The computing system 1000 can be analogous to the package 200 and the package 600, which include a die, a mounting substrate, and a board. Consequently the package 1010 (including a die) and the board 1020 are analogous to these structures.

For purposes of this disclosure, a computing system 1000 embodying components in accordance with the claimed subject matter may include any system that ultilizes a microelectronic device system, which may include, for example, at least one of the BLM embodiments and/or the bump embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 1012.

In an embodiment, the computing system can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor (in package 1010) and the DSP as separate parts of the chipset on the board 1020. In this embodiment, an embodiment(s) configuration is coupled to the DSP, and a separate embodiment(s) configuration may be present that is coupled to the processor in package 1010. Additionally in an embodiment, an embodiment(s) configuration is coupled to a DSP that is mounted on the same board 1020 as the package 1010. It can now be appreciated that the embodiment(s) configuration can be combined as set forth with respect to the computing system 1000, in combination with an embodiment(s) configuration as set forth by the various embodiments of this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   first attaching a die to a mounting substrate, wherein the die includes a refractory metal-vanadium layer and an upper layer of a copper cap layer disposed above and on the refractory metal-vanadium layer, and wherein the copper cap is coupled to a solder bump, wherein the solder bump is selected from a eutectic-Pb solder, a high-Pb solder, and combinations thereof and
   reflowing the solder bump at a first temperature above about 210°.

2. The process of claim 1, wherein first attaching includes attaching the solder bump to the copper layer, wherein the copper layer is in a thickness range from about 1,000 Å to about 10,000 Å.

3. The process of claim 1 wherein the first temperature is in a range from about 220° C. to about 260°0 C.

4. The process of claim 1 further including:
   second attaching the mounting substrate to a board at a second temperature that is higher than the first temperature.

5. The process of claim 1 further including:
   second attaching the mounting substrate to a board at a second temperature that is higher than the first temperature, wherein the second temperature is in a range from about 240° C. to about 260° C.

6. The process of claim 1, further including:
   second attaching the mounting substrate to a board at a second temperature that is higher than the first temperature, wherein the second temperature is in a range from about 250° C. to about 260° C.; and
   further heating the solder bump to a temperature in a range from about 220° C. to about 260° C.

7. The process of claim 1, wherein first attaching includes first attaching the die to the mounting substrate with the high-Pb first solder in a concentration of about Sn97Pb until the solder bump achieves reflow.

8. The process of claim 1, wherein attaching the first die is preceded by attaching the high-Pb first solder to a metallurgy disposed on the die, wherein the metallurgy includes:
a refractory metal first layer disposed above and on a metallization;
the refractory metal-vanadium second layer disposed above and on the metal first layer, wherein the metal-vanadium second layer is an Al/R1/R2V laminate, wherein R1 is a refractory metal, wherein R2 is a refractory metal, wherein Al is aluminum, and wherein V is vanadium; and
the copper metal upper layer disposed above and on the metal-vanadium second layer.

9. A process comprising:
attaching a eutectic-Pb solder to a ball-limiting metallurgy, wherein the ball-limiting metallurgy includes:
a refractory metal first layer disposed above and on a metallization;
a metal second layer disposed above and on the metal first layer, wherein the metal second layer is an Al/R1/R2V laminate, wherein R1 is a refractory metal, wherein R2 is a refractory metal, wherein Al is aluminum, and wherein V is vanadium; and a copper metal upper layer disposed above and on the metal second layer; attaching the eutectic-Pb solder to a mounting substrate; and reflowing the eutectic-Pb solder.

10. The process of claim 9, further including attaching the mounting substrate to a board through a lead-free solder.

11. The process of claim 9, further including:
attaching the mounting substrate to a board through a lead-free solder; and
reflowing the lead-free solder.

12. The process of claim 1, wherein attaching the first die is preceded by attaching the high-Pb first solder to a metallurgy disposed on the die, wherein the metallurgy includes:
a refractory metal first layer disposed above and on a metallization;
the refractory metal-vanadium second layer disposed above and on the metal first layer, wherein the metal-vanadium second layer is an R2V laminate, wherein R2 is a refractory metal, and wherein V is vanadium; and
the copper metal upper layer disposed above and on the metal-vanadium second layer.

13. A process comprising:
first attaching a die to a mounting substrate, wherein the die includes a refractory metal-vanadium layer and an upper layer of a copper cap layer disposed above and on the refractory metal-vanadium layer, and wherein the copper cap is coupled to a solder bump, wherein the solder bump is selected from a eutectic-Pb solder, a high-Pb solder, and combinations thereof;
reflowing the solder bump at a first temperature above about 210°;
second attaching the mounting substrate to a board at a second temperature that is higher than the first temperature; and
further heating the solder bump to a temperature in a range from about 220° C. to about 260° C.

14. The process of claim 13, wherein first attaching the die is preceded by attaching the solder bump to a metallurgy disposed on the die, wherein the metallurgy includes:
a refractory metal first layer disposed above and on a metallization;
the refractory metal-vanadium second layer disposed above and on the metal first layer, wherein the metal-vanadium second layer is an Al/R1/R2V laminate, wherein R1 is a refractory metal, wherein R2 is a refractory metal, wherein Al is aluminum, and wherein V is vanadium; and
a copper metal upper layer disposed above and on the metal-vanadium second layer.

15. The process of claim 13, wherein first attaching the die is preceded by attaching the solder bump to a metallurgy disposed on the die, wherein the metallurgy includes:
a refractory metal first layer disposed above and on a metallization;
the refractory metal-vanadium second layer disposed above and on the metal first layer, wherein the metal-vanadium second layer is an R2V laminate, wherein R2 is a refractory metal, and wherein V is vanadium; and
the copper metal upper layer disposed above and on the metal-vanadium second layer.

16. A process comprising:
attaching a eutectic-Pb solder to a ball-limiting metallurgy, wherein the ball-limiting metallurgy includes:
a refractory metal first layer disposed above and on a metallization;
a metal second layer disposed above and on the metal first layer, wherein the metal second layer is an R2V laminate, wherein R2 is a refractory metal, wherein Al is aluminum, and wherein V is vanadium; and
a copper metal upper layer disposed above and on the metal second layer; attaching the eutectic-Pb solder to a mounting substrate; and
reflowing the eutectic-Pb solder.

17. The process of claim 16, further including attaching the mounting substrate to a board through a lead-free solder.

18. The process of claim 16, further including:
attaching the mounting substrate to a board through a lead-free solder; and
reflowing the lead-free solder.

19. A process comprising:
forming a bond pad in a mounting substrate;
forming a nitride layer above and on the bond pad and the mounting substrate;
forming a passivation layer above and on the nitride layer;
patterning through the passivation layer and the nitride layer to form a recess therein that exposed the bond pad;
curing the passivation layer;
sputtering a refractory metal first layer above and on the bond pad and the passivation layer; and
sputtering a refractory metal second layer above and on the refractory metal first layer, wherein the refractory metal second layer is selected from an Al/R1/R2V laminate and an R2V laminate, wherein R1 is a refractory metal, wherein R2 is a refractory metal, wherein Al is aluminum, and wherein V is vanadium.

20. The process of claim 19, further including forming a copper metal upper layer above and on the refractory metal second layer.

21. The process of claim 19, further including:
forming a copper metal upper layer above and on the refractory metal second layer;
attaching a solder bump to the copper metal upper layer;
reflowing the solder bump at a first temperature above about 210°;

second attaching the mounting substrate to a board at a second temperature that is higher than the first temperature; and further heating the solder bump to a temperature in a range from about 220° C. to about 260° C.

22. The process of claim 19, wherein sputtering the refractory metal first layer above and on the bond pad and the passivation layer is carried out under conditions to have it carry a compressive stress that resists liftoff from the passivation layer.

23. The process of claim 19, wherein sputtering the refractory metal second layer above and on the refractory metal first layer is carried out under conditions to have it carry a compressive stress.

* * * * *